United States Patent
Han et al.

(10) Patent No.: US 8,072,816 B2
(45) Date of Patent: *Dec. 6, 2011

(54) MEMORY BLOCK REALLOCATION IN A FLASH MEMORY DEVICE

(75) Inventors: Jin-Man Han, Santa Clara, CA (US); Aaron Yip, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 223 days.

This patent is subject to a terminal disclaimer.

(21) Appl. No.: 12/478,877

(22) Filed: Jun. 5, 2009

(65) Prior Publication Data

US 2009/0244982 A1   Oct. 1, 2009

Related U.S. Application Data

(60) Continuation of application No. 11/635,708, filed on Dec. 7, 2006, now Pat. No. 7,551,510, which is a division of application No. 11/116,597, filed on Apr. 28, 2005, now Pat. No. 7,400,549.

(51) Int. Cl.
G11C 16/06 (2006.01)

(52) U.S. Cl. ......... 365/185.23; 365/185.11; 365/185.17; 365/230.06

(58) Field of Classification Search ............ 365/185.23, 365/185.11, 185.17, 230.06
See application file for complete search history.

(56) References Cited

U.S. PATENT DOCUMENTS

| | | | |
|---|---|---|---|
| 5,297,029 A | 3/1994 | Nakai et al. | |
| 5,544,356 A | 8/1996 | Robinson | |
| 5,809,558 A | 9/1998 | Matthews | |
| 6,131,139 A | 10/2000 | Kikuchi et al. | |
| 6,175,900 B1 | 1/2001 | Forin | |
| 6,373,753 B1* | 4/2002 | Proebsting | 365/189.09 |
| 6,747,908 B2* | 6/2004 | Lee et al. | 365/230.03 |
| 6,757,800 B1 | 6/2004 | Estakhri et al. | |
| 7,054,219 B1* | 5/2006 | Petti et al. | 365/230.06 |
| 7,167,944 B1 | 1/2007 | Estakhri | |
| 7,215,580 B2 | 5/2007 | Gorobets | |
| 7,239,552 B2 | 7/2007 | Louie et al. | |
| 7,551,510 B2* | 6/2009 | Han et al. | 365/230.03 |
| 2004/0221121 A1 | 11/2004 | Hamilton, II | |

* cited by examiner

*Primary Examiner* — Pho M Luu
(74) *Attorney, Agent, or Firm* — Leffert Jay & Polglaze, P.A.

(57) ABSTRACT

A non-volatile memory device has the pages of a certain memory block reallocated to other blocks in order to increase decrease disturb and increase reliability. Each of the reallocation blocks that contain the reallocated pages from the desired memory block are coupled to a wordline driver. These wordline drivers have a subset of the global wordlines as inputs. The desired wordline driver is selected by an appropriate select signal from a block decoder and an indication on an appropriate global wordline. This causes the wordline driver to generate a local wordline to the desired block with the reallocated page to be accessed.

20 Claims, 4 Drawing Sheets

MEMORY BLOCK REALLOCATION IN A FLASH MEMORY DEVICE

RELATED APPLICATION

This Application is a Continuation of U.S. application Ser. No. 11/635,708, titled "MEMORY BLOCK REALLOCATION IN A FLASH MEMORY DEVICE," filed Dec. 7, 2006, now U.S. Pat. No. 7,551,510 issued on Jun. 23, 2009, which is a Divisional of U.S. application Ser. No. 11/116,597, filed Apr. 28, 2005, now U.S. Pat. No. 7,400,549 issued on Jul. 15, 2008, which are commonly assigned and incorporated herein by reference.

TECHNICAL FIELD OF THE INVENTION

The present invention relates generally to memory devices and in particular the present invention relates to flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Block 0 of a flash memory device is typically advertised by the IC manufacturer to be a defect free block. This block can be used by electronics manufacturers to store data that cannot tolerate bit errors due to memory defects or an access disturb. For example, a computer manufacturer may use Block 0 to hold a computer's BIOS.

Block 0 is physically the same as the other blocks in the memory device; it is not made more reliable than the other blocks. This block is tested for defects at the factory during the manufacturing process. If it is determined to have a defect, that particular part has to be destroyed. This decreases the manufacturer's part yield, thus increasing costs.

For the reasons stated above, and for other reasons stated below which will become apparent to those skilled in the art upon reading and understanding the present specification, there is a need in the art for a way to improve the reliability of a particular block in a memory device.

DETAILED DESCRIPTION

Figure 1:
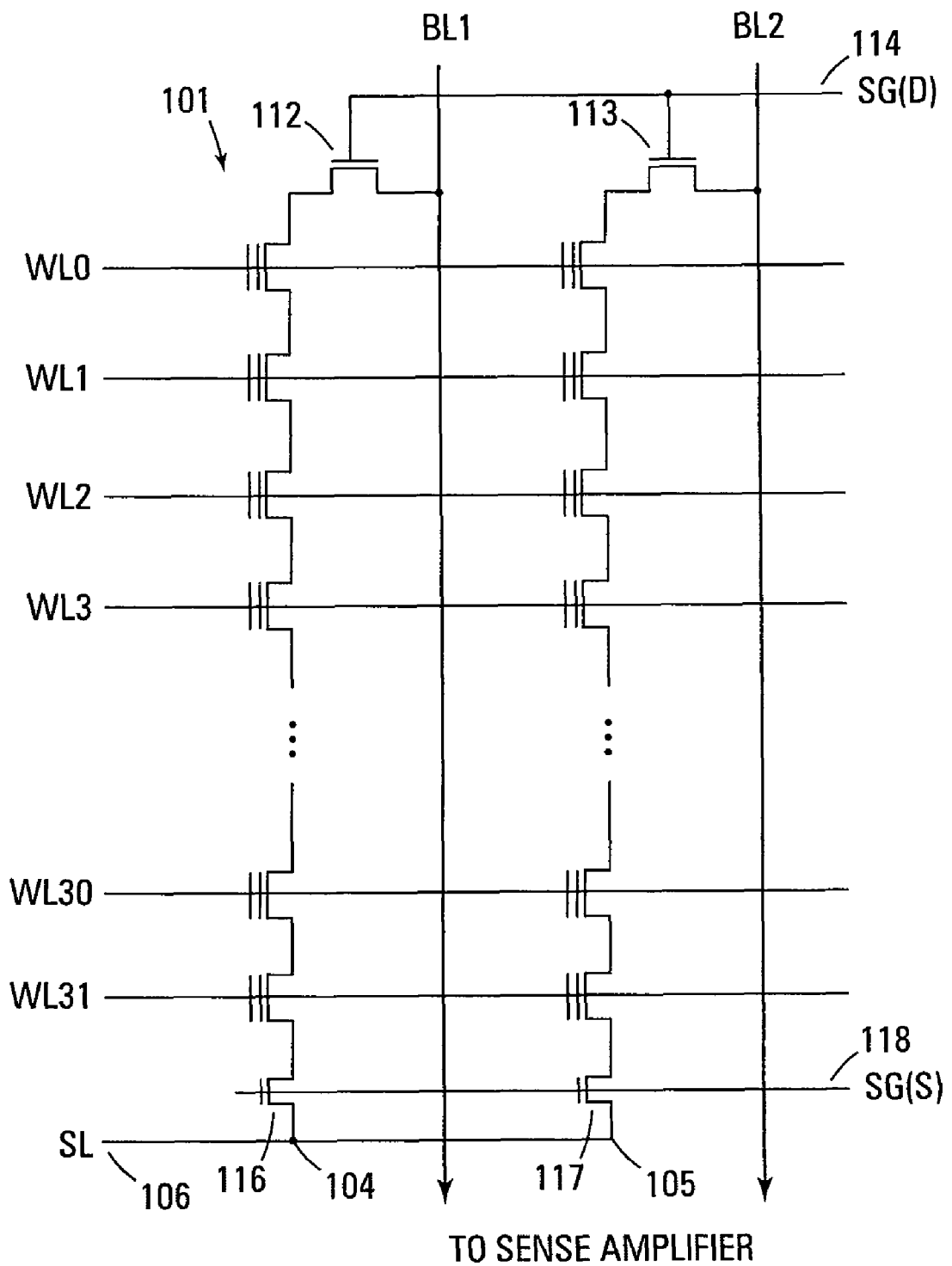
FIG. 1 shows a portion of one embodiment of a NAND flash memory array architecture of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified diagram of one embodiment for a NAND flash memory array of the present invention. The memory array of FIG. 1, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 101 arranged in series strings 104 and 105. Each of the floating gate cells 101 are coupled drain to source in each series chain 104 and 105. A word line (WL0-WL31) that spans across multiple series strings 104 and 105 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 104 and 105 to be written to or read from and operate the remaining floating gate memory cells in each series string 104 and 105 in a pass through mode. Each series string 104 and 105 of floating gate memory cells is coupled to a source line 106 by a source select gate 116 and 117 and to an individual bitline (BL1-BLN) by a drain select gate 112 and 113. The source select gates 116 and 117 are controlled by a source select gate control line SG(S) 118 coupled to their control gates. The drain select gates 112 and 113 are controlled by a drain select gate control line SG(D) 114.

Each cell can be programmed as a single bit per cell (i.e., single level cell—SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected wordline for the flash memory cell to be programmed is biased with a programming pulse at a voltage that is greater than a predetermined programming voltage (e.g., approximately 16V). A verification operation with a wordline voltage of 0V is then performed to determine if the floating gate is at the proper voltage (e.g., 0.5V). The unselected wordlines for the remaining cells are typically biased at a voltage that is less than the programming voltage (e.g., approximately 10V) during the program operation. In one embodiment, the unselected wordline voltages can be any voltage above ground potential. Each of the memory cells is programmed in a substantially similar fashion.

A typical memory block is comprised of 64 pages. When one of these pages is accessed, the remaining pages in the block experience a disturb condition. This occurs for both a read and a write access. In both cases, the pages share common wordlines and bitlines that can experience programming/read voltages whenever any one of the pages is programmed/read. These voltages can cause problems for the cells that are not being accessed.

Figure 2:
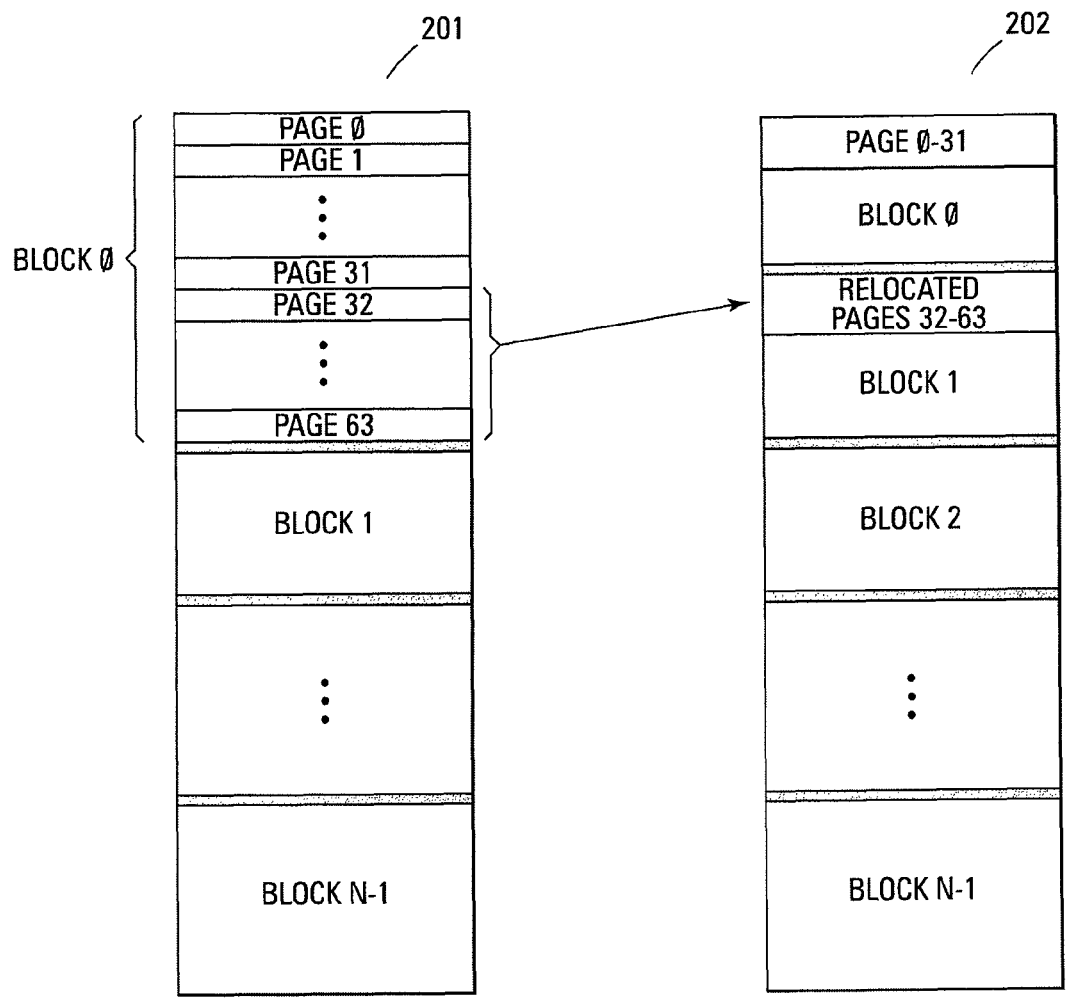
FIG. 2 shows a block diagram of one embodiment of a method of the present invention for reallocating portions of a particular block to multiple blocks.

FIG. 2 illustrates a block diagram of one embodiment of a method of the present invention for reallocating portions of a particular block to multiple blocks. In one embodiment, the block to be reallocated is block 0. However, the reallocation can be accomplished with any block of a memory array that requires greater reliability without requiring significant architectural changes to the memory circuit.

In this embodiment, pages 0-31 in the old page layout 201 are left in block 0 while pages 32-63 of block 0 are physically reallocated to block 1 in the new page layout 202. Therefore, when the cells in pages 0-31 are accessed with either a read or program operation, pages 32-63 will not experience read or program disturb.

The embodiment illustrated in FIG. 2 shows only one of many different ways to reallocate the pages of block 0. This embodiment reallocates 32 pages into two separate blocks. As an extreme example, each page from the block to be reallocated can be reallocated to a separate block. This would require 64 blocks (i.e., one page per block). Once the page has been reallocated, only that particular page in the block is accessed.

After one or more pages have been reallocated to another block or blocks, the remainder of each block to which a page has been reallocated is not accessed for either a read or a write operation. For example, referring to the embodiment of FIG. 2, pages 0-31 are in block 0 and pages 32-63 of block 0 are no longer accessed. Similarly, 32 pages of block 1 are no longer accessed. This substantially reduces the amount of disturb experienced by the reallocated pages, thus increasing their reliability.

During an erase operation, the entire block is erased. Additionally, when a command is received to erase the block that has been reallocated, the reallocated pages in each block are erased. For example, if block is to be reallocated, pages 0-15 can be left in block 0, pages 16-31 can be moved to block 1, pages 32-57 can be moved to block 2, and pages 58-63 can be moved block 3. When it is desired to erase block 0, an erase operation is executed that erases blocks 0-3.

The embodiments of the present invention do not require that the page being reallocated be the same location in the new block. For example, page 1 of block 0 can be reallocated to page 4 of block 1. Also, the reallocated pages do not have to be contiguous. For example, all the odd pages from one block can be allocated to another block or blocks.

The embodiments for reallocating can be used with the redundant blocks typically used in flash memory devices. Flash memory devices have redundant memory blocks in addition to the main memory array. A redundant block can be used in place of a memory block that has been found to be defective during the manufacturing and testing process. After the redundant memory blocks have been allocated to replace any defective memory blocks, the pages to be reallocated from a particular block can be divided between the remaining redundant memory blocks.

Figure 3:
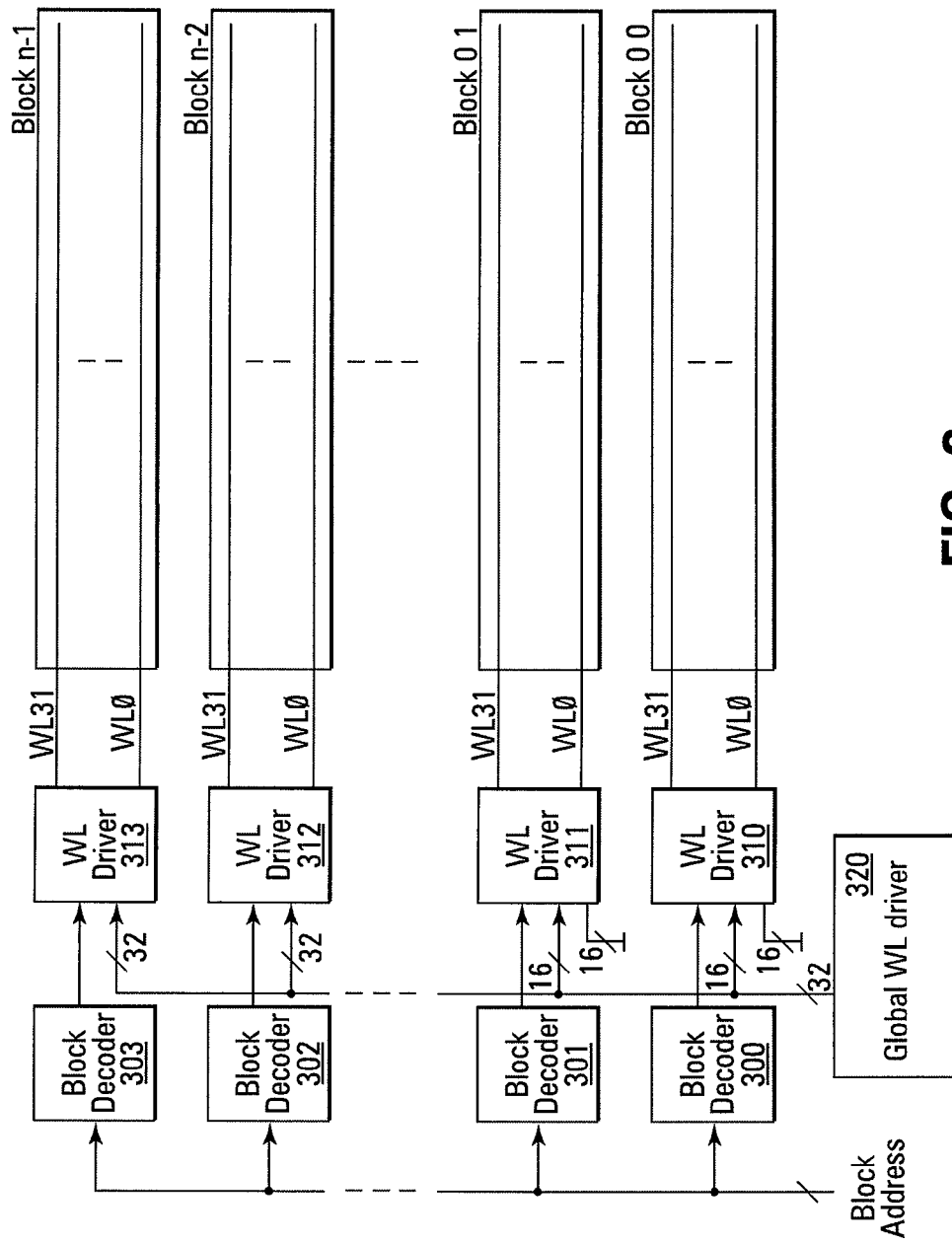
FIG. 3 shows a block diagram of one embodiment of a circuit to reallocate a particular block into multiple physical blocks.

FIG. 3 illustrates a block diagram of one embodiment of a circuit for reallocating pages of a NAND flash block. This diagram shows n blocks and that block 0 has been divided up into two physical blocks Block 0_0 and Block 0_1. This division is for purposes of illustration only as the present invention is not limited to splitting up block 0 into any one quantity of blocks. Additionally, block 0 does not have to be the block to be divided. The circuit of FIG. 3 will operate with any desired block.

A block decoder 300-303 decodes received block addresses to select 1 out of n memory blocks. The appropriate decoder 300-303 generates a select signal if the incoming address matches the address range assigned to the block decoder 300-303. The generated select signal from the appropriate decoder 300-303 is coupled to its respective wordline driver 310-313.

Since, in the illustrated embodiment, the block is split into two blocks, each new block has a different wordline driver. For example, Block 0_0 is coupled to a first wordline driver 310 and Block 0_1 is coupled to a second wordline driver 311. Each of the first and second wordline drivers 310 and 311 are coupled to 16 global wordlines. If an alternate embodiment divides the block into more than two physical blocks, the 32 global wordlines that would normally go to the single wordline driver are divided evenly among the wordline drivers. For example, if Block 0 is divided into four physical blocks, each of the four wordline drivers assigned to each of the four physical blocks would be coupled to eight global wordlines. The remaining unused global wordline inputs can be tied to $V_{CC}$ or some other voltage that is not high enough to disrupt the memory cells (e.g., <5V).

The rest of the wordline drivers 312 and 313 each receive 32 global wordlines from the global wordline driver circuit 320. Using selection logic, only the wordline driver that receives the select signal allows the 32 global wordlines to pass through. In other words, only one selected block will receive a global wordline signal.

In operation, an address is transmitted to the circuit that is in the range of addresses assigned to block 0. If the address is in the upper address range of block 0, the top block decoder 301 generates a select signal. This signal is transmitted to the appropriate wordline driver 311 that is coupled to the desired Block 0_1. The wordline driver 311 can then allow through the appropriate global wordline of the 16 global wordlines received from the global wordline driver 320.

Figure 4:
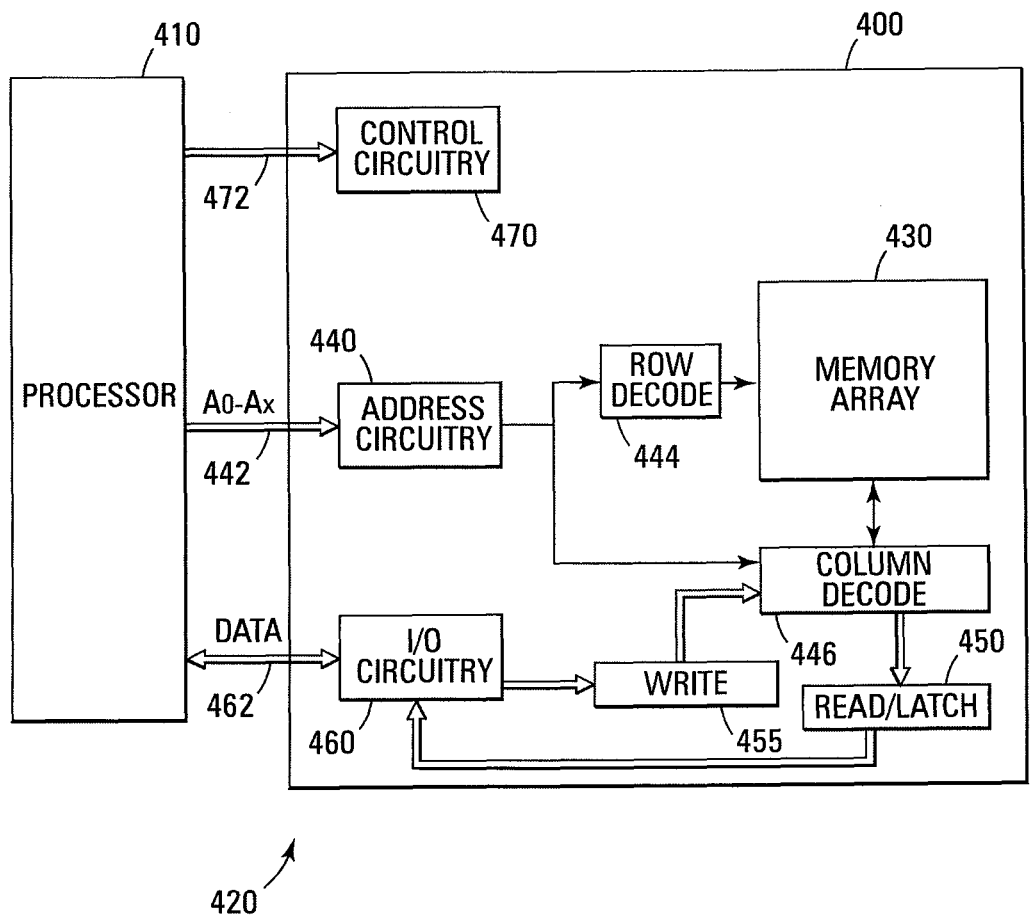
FIG. 4 shows a block diagram of one embodiment of an electronic system of the present invention.

FIG. 4 illustrates a functional block diagram of a memory device 400 that can incorporate the flash memory array and memory block reallocation embodiments of the present invention. The memory device 400 is coupled to a processor 410 that generates the memory signals. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of flash memory cells 430 as described above with reference to FIG. 1. The memory array 430 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write (program), and erase operations. The control circuitry 470 may be a state machine, a sequencer, or some other type of controller. In one embodiment, the control circuitry 470 is responsible for executing the embodiments of the programming method of the present invention.

The flash memory device illustrated in FIG. 4 has been simplified to facilitate a basic understanding of the features of the memory. A more detailed understanding of internal circuitry and functions of flash memories are known to those skilled in the art.

CONCLUSION

In summary, the embodiments of the present invention reconfigure a particular block (e.g., block 0) of a flash memory array so that it is more reliable than other array blocks without incurring significant architectural changes. This can increase parts yield for the IC manufacturer and, thus, decrease manufacturing costs. When a user accesses block 0, statistically only about half or less of logical block 0 is selected. Therefore, over the lifespan of the flash memory, physical block 0 is accessed less than half of the time as compared to the prior art method of access. This reduces the wear and tear of physical block 0 or any other desired block.

These embodiments encompass a memory device that has a plurality of memory blocks including a predetermined memory block to be reallocated. The predetermined memory block is comprised of a plurality of pages that are to be physically reallocated to other blocks. In one embodiment, the predetermined block is block 0 of the device. A wordline driver is coupled to each of the plurality of memory blocks. A plurality of global wordlines is coupled to each wordline driver. A subset of the plurality of global wordlines is amongst the wordline drivers that are coupled to each of the memory blocks comprising at least one of the plurality of pages to be reallocated.

One embodiment for a method for reallocating pages of a predetermined memory block includes determining the predetermined pages to be reallocated. These pages are physically reallocated to at least one other physical memory block.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
    a global wordline driver;
    n global wordlines coupled to the global wordline driver; and
    m local wordline drivers each coupled to a respective one of m physical memory blocks and having n global wordline inputs, wherein at least one of the n global wordline inputs of at least two of the m local wordline drivers are not coupled to at least one of the n global wordlines.

2. The memory device of claim 1 wherein the at least two of the m local wordline drivers is coupled to different pages of memory block 0.

3. The memory device of claim 1 wherein a first one of the m physical memory blocks is coupled to the at least two local wordline drivers comprises a total of x+y pages, wherein only the x pages of the first one of the physical memory blocks can be accessed during operation and wherein a second one of the physical memory blocks coupled to the at least two local wordline drivers comprises a total of x+y pages, wherein only the y pages of the second one of the physical memory blocks can be accessed.

4. The memory device of claim 3 wherein both the x pages and the y pages of the first and second ones of the first physical memory blocks are erased during an erase operation.

5. The memory device of claim 3 wherein the x pages are contiguous to one another in each of the physical memory blocks and the y pages are contiguous to one another in each of the physical memory blocks.

6. The memory device of claim 3 wherein the x pages of the first one of the physical memory blocks are in a same respective physical location within the first one of the physical memory blocks as the y pages of the second one of the physical memory blocks are within the second one of the physical memory blocks.

7. The memory device of claim 1 wherein at least one of the at least two of the m local wordline drivers is coupled to a physical memory block that is otherwise configured to replace a defective one of the other physical memory blocks.

8. The memory device of claim 1 and further comprising m block decoders each coupled to a respective one of the m local wordline drivers.

9. The memory device of claim 1 wherein the global wordline inputs that are not coupled to the at least one of the n global wordlines are coupled to a supply voltage.

10. The memory device of claim 3 wherein the x pages are odd pages and the y pages are even pages.

11. The memory device of claim 1 wherein a first one of the physical memory blocks coupled to the at least two local wordline drivers comprises x pages and wherein a second one of the physical memory blocks coupled to the at least two local wordline drivers comprises y pages.

12. A memory device comprising:
    a global wordline driver;
    a plurality of global wordlines coupled to the global wordline driver;
    a first plurality of local wordline drivers each coupled to a respective one of a first plurality of physical memory blocks; and
    a second plurality of local wordline drivers each coupled to a respective one of a second plurality of physical memory blocks, wherein each of the first plurality of local wordline drivers are coupled to the plurality of global wordlines and wherein the second plurality of local wordline drivers are coupled to the plurality of global wordlines such that the plurality of global wordlines is divided between the second plurality of local wordline drivers.

13. The memory device of claim 12 and further comprising a different block decoder coupled to each local wordline driver wherein each block decoder is configured to receive memory block addresses.

14. The memory device of claim 13 wherein each block decoder is configured to generate a select signal when a received address is within an address range assigned to a particular block decoder.

15. The memory device of claim 13 wherein each block decoder is configured to enable its respective local wordline driver in response to a received memory address.

16. The memory device of claim 15 wherein each of the local wordline drivers allow their respective plurality of global wordlines to pass through in response to the block decoder.

17. A memory device comprising:
a global wordline driver;
a plurality of local wordline drivers coupled to the global wordline driver by a plurality of global wordlines;
a plurality of memory blocks, each memory block coupled to a different one of the plurality of local wordline drivers;
a plurality of block decoders, each block decoder coupled to a different one of the plurality of local wordline drivers, each block decoder configured to decode a received block address and enable its respective local wordline driver,
wherein a first memory block of the plurality of memory blocks is divided between a first and a second local wordline driver.

18. The memory device of claim 17 wherein the first memory block is equally divided between the first and the second local wordline drivers.

19. The memory device of claim 18 wherein a subset of the plurality of global wordlines is enabled to pass through one of the first or the second local wordline drivers in response to a signal from the respective block decoder coupled to the first or the second local wordline driver.

20. The memory device of claim 17 wherein the first memory block is divided into a plurality of physical memory blocks wherein each of the plurality of physical memory blocks is coupled to a different one of the plurality of local wordline drivers and each of the plurality of local wordline drivers is coupled to a subset of the plurality of global wordlines.

* * * * *